United States Patent [19]

D'Amato

[11] Patent Number: 4,993,097
[45] Date of Patent: Feb. 19, 1991

[54] CIRCUIT BOARD DEBURRING SYSTEM

[75] Inventor: Mark D'Amato, Montreal, Canada

[73] Assignee: D.E.M. Controls of Canada, Montreal, Canada

[21] Appl. No.: 468,094

[22] Filed: Jan. 22, 1990

Related U.S. Application Data

[63] Continuation-in-part of Ser. No. 388,111, Jul. 31, 1989.

[51] Int. Cl.$^5$ .............................................. B08B 13/02
[52] U.S. Cl. ......................................... 15/77; 15/88.1; 15/102; 51/165.87
[58] Field of Search ................ 15/21.1, 77, 88.2, 88.3, 15/88.4, 97.1, 102; 51/165.77, 165.87, 24; 29/DIG. 7, DIG. 98; 72/40

[56] References Cited

U.S. PATENT DOCUMENTS

| | | | |
|---|---|---|---|
| 3,795,931 | 3/1974 | Martino | 15/77 |
| 4,382,308 | 5/1983 | Curcio | 15/77 |
| 4,604,835 | 8/1986 | Borin | 15/88.3 |

*Primary Examiner*—Edward L. Roberts
*Attorney, Agent, or Firm*—Stetina and Brunda

[57] ABSTRACT

An apparatus and method are disclosed for deburring the surface of a printed circuit board passing along a moving conveyor. The apparatus comprises a rotating brush head for abrading against the first surface of the printed circuit board. A three phase wattmeter is utilized to sense the power consumption of the motor driving the rotating brush head and generate a signal in response thereto. A control circuit is connected to the three phase wattmeter and regulates the elevation of the brush head in response to the three phase power consumption of the motor. A sensor, such as an optical sensor is provided to sense the thickness and/or surface characteristics of circuit boards before they meet the rotating brush head. A sensor output signal is generated and utilized to preadjust the height of the rotating brush head before it meets the surface of each incoming surface of each incoming surface circuit board. After the rotating brush head has met each incoming circuit board, the output signal from the three phase wattmeter will override the output signal from said sensor, thereby permitting the rotating brush head to accomplish a desired finish on each passing circuit board. Thereafter, the input received from the sensor will permit the rotating brush head to again preadjust to a desired height before it meets the next incoming circuit board.

10 Claims, 4 Drawing Sheets

CIRCUIT BOARD DEBURRING SYSTEM

RELATED INVENTIONS

The subject application is a continuation-in-part patent application Ser. No. 388,111 filed on July 31, 1989 entitled Circuit Board Deburring System.

FIELD OF THE INVENTION

The present invention pertains generally to the art of circuit board manufacturing and more particularly to a system and device for removing burrs from the surfaces of circuit boards and similar work pieces.

BACKGROUND OF THE INVENTION

In the fabrication of circuit boards it is necessary to deburr and polish the surfaces of newly manufactured circuit boards prior to disposition of the electrical circuitry thereon. In the prior art, it has been common practice to utilize deburring machines having rotating cylindrical brushes which pass over the surface of the circuit board so as to remove undesirable burrs and surface imperfections. Such cylindrical brushes generally comprise a single shaft with a brush head extending therefrom.

Difficulties frequently arise as a consequence of variations in the pressure of the brush head against the surface of the printed circuit board. Failure to maintain proper constant pressure against the circuit board results in too little or too much abrasion of the circuit board surface. Preferably, such irregularities are eliminated such that the a smooth even surface is produced, which is accurately repeatable from board to board. Moreover, after substantial usage the central shaft of such brushes may undergo slight bending during operation. The bending of the shaft may result in uneven wearing of the board surfaces.

Accordingly, there exists a need to provide an improved circuit board deburring system which provides for close regulation of the pressure exerted on the board surface so as to enable close tolerance deburring and polishing. More particularly, there exists a need for an improved deburring system which incorporates highly sensitive means for controlling the downward pressure exerted by the rotating/oscillating brush, despite the different thickness of circuit boards.

SUMMARY OF THE INVENTION

The present invention overcomes some or all of the problems in a circuit board deburring system having a rotating brush head which oscillates or traverses from side to side as a circuit board passes therebeneath. The circuit board deburring system of the present invention incorporates a highly sensitive and responsive closed loop feedback system for controlling the downward pressure exerted by the rotating/oscillating brush.

An apparatus and method are disclosed for deburring the surface of a printed circuit board passing along a moving conveyor. The apparatus comprises a rotating brush head for abrading against the first surface of the printed circuit board. A three phase wattmeter is utilized to sense the power consumption of the motor driving the rotating brush head and generate a signal in response thereto. A control circuit is connected to the three phase wattmeter and regulates the elevation of the brush head in response to the three phase power consumption of the motor.

The control circuit for regulating the elevation of the brush head preferably comprises a comparator which operates to compare an output from the three phase wattmeter to a reference signal representative of the anticipated power consumption of the motor necessary to provide a desired surface finish. The reference signal may be varied to effect different surface finish characteristics on the printed circuit board surface.

Additional regulation of the elevation of the brush head may be effected by sensing the surface characteristics of the output printed circuit board and comparing the sensor output signal to a signal representative of the desired surface characteristics. Differences between the two signals may then be used to further regulate the elevation of the brush head.

Lateral movement of the brush head is also preferably regulated in order to provide an even surface finish on the printed circuit board. The disclosure sets forth pneumatic and mechanical mechanisms for laterally translating the brush head along the surface of the printed circuit board. In order to effect optimum deburring the translation of the brush head should closely follow the conveyor speed. The invention provides a mechanism for sensing the conveyor speed and regulating the translation of the deburring head across the surface of the printed circuit board in response to the sensed conveyor speed.

BRIEF DESCRIPTION OF THE DRAWINGS

FIG. 3b is an exploded cross-sectional view of portion B-B' of FIG. 3a.

DETAILED DESCRIPTION OF THE PREFERRED EMBODIMENT

The following detailed description and the accompanying drawings are intended for purposes of illustrating and describing preferred embodiments of the invention and are not intended to limit the scope of the invention in any way.

Figure 1:
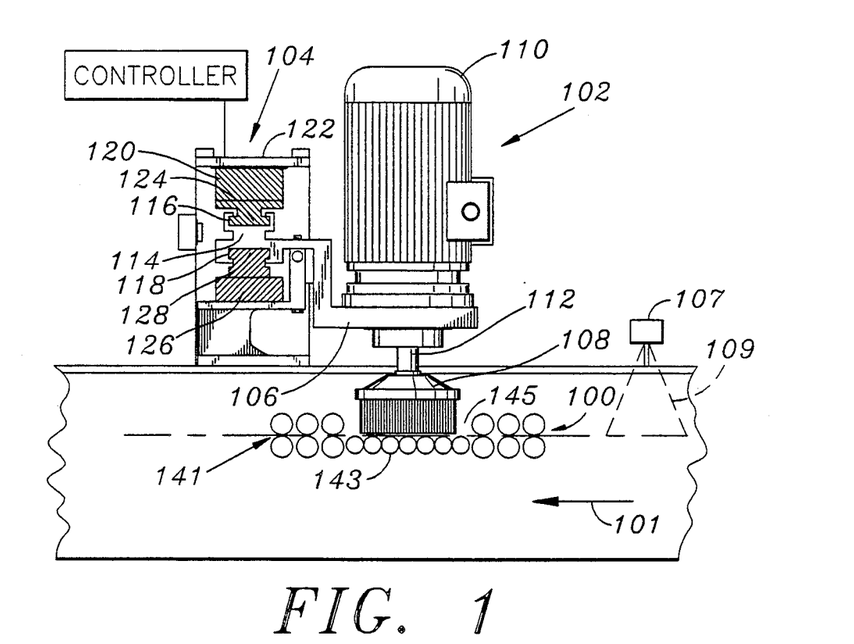
FIG. 1 is a side elevational view of a preferred circuit board deburring machine of the present invention.
Figure 2:
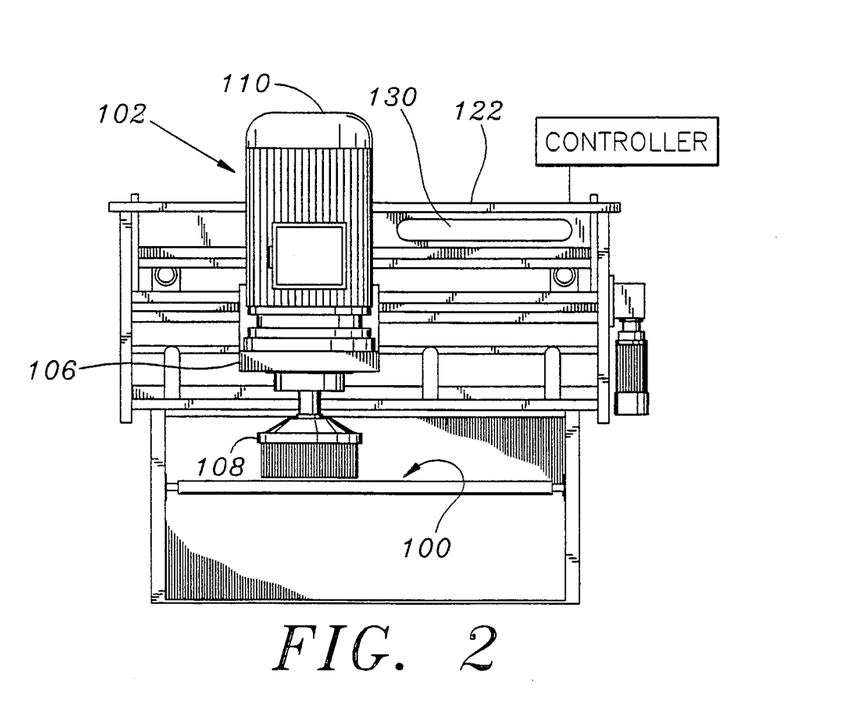
FIG. 2 is a front elevational view of a preferred circuit board deburring machine of the present invention.

Referring to FIGS. 1 and 2, a preferred circuit board deburring machine of the present invention comprises a conveyor 100 for moving circuit boards or similar work pieces along a fixed conveyor path and a brush assembly 102 positioned above said conveyor 100 and operative to effect deburring and polishing of circuit boards passing along the conveyor path.

Preferably, the conveyor 100 is constructed so that the circuit boards passing therealong in direction 101 will be held firmly, without appreciable side to side movement, as the rotating/oscillating brush passes over the circuit board surface. For example, as shown in FIG. 1, the conveyor 100 may consist of a series of vertically opposed roller pairs 141 aligned before and after the operative position of the brush 108. A series of smaller, lower rollers 143 are aligned directly beneath the brush. Thus, a window 145 or open region is created whereby the brush 108 may achieve direct contact with the passing circuit boards. The length of the window 145 is preferably such that the leading edge of each circuit board will be firmly engaged between the opposing rollers 141 positioned behind or past the brush 108 before the trailing edge of the circuit board has emerged from the grip of the opposing rollers 141 positioned ahead of the brush. By such arrangement the circuit boards will remain firmly gripped or pinched between the conveyor rollers and will thereby be prevented from sliding from side to side as the brush 108 makes its repeated lateral passes across the circuit board surface sensor 107, having field of view 109 is disposed along the path of conveyor 100 upstream of the assembly 102. As described below the sensor 107 is useful to preposition the height of the brush 108.

The rotating/oscillating brush assembly 102 is attached to an oscillation mechanism 104 by way of bracket 106. Bracket 106 is slidably disposed within oscillation mechanism 104 so that the rotating/oscillating brush assembly 102 will laterally traverse back and forth across the approximate width of conveyor 100.

The brush assembly 102 comprises a generally circular deburring brush head 108 connected to motor 110 by way of shaft 112. Motor 110 operates to rotate shaft 112 and brush 108. The preferred brush 108 for use in connection with the present invention is a silicon carbide impregnated nylon filament bristle brush of the type manufactured by duPont de Nemours Corporation, Wilmington, Del. under the tradename "Tynex" or a brush having bristles made of a similar material manufactured by the 3-M Company, Minneapolis, Minn. under the tradename "Brushlon". Brushes having these specified types and composition of bristles may be obtained from a number of commercial brush companies such as the Fuller Brush Company of California. The preferred brush motor 110 is a 1.5 hp. three phase National Electronics Manufactures Association #90 frame D-flange mount electric motor commonly available from any electric motor manufacturer.

The bracket 106 which joins the rotating brush assembly 102 to the oscillation mechanism 104 comprises a substantially "Z" shaped bracket 106. The end of the bracket 106 disposed within oscillation mechanism 104 is connected directly to a slide member 114. Slide member 114 comprises a solid body having an upper guide track 116 and a lower guide track 118 formed there within.

An upper guide member 120 extends downwardly from the top of housing 122. Similarly, a lower guide member 126 is positioned within housing 122. By such arrangement, the guide member 114 and connected bracket 106 are permitted to slidably move from side to side along the upper 116 and lower 118 linear guide tracks. This permits the brush assembly 102 to traverse the width of the conveyor such that the brush head 108 will repeatedly pass, back and forth, over the surfaces of circuit boards as they move longitudinally along the conveyor path.

The propelling force for lateral, i.e. side to side, oscillation of the brush assembly 102 is provided by a lateral oscillation drive mechanism mounted within the machine. The drive mechanism functions to propel the brush assembly 102, slidably back and forth such that the slide member 114 will slide longitudinally on upper guide rail 116 and lower guide rail 118. As a result, the brush head 108 is caused to traverse, back and forth, across the width of conveyor 100.

The oscillation drive mechanism may comprise any type of device capable of bringing about the desired back and forth movement of the brush assembly 102. In particular, two presently preferred embodiments of the oscillation drive mechanism are anticipated. A first preferred embodiment comprises a pneumatic oscillation device while a second preferred embodiment comprises a mechanical ball reverser shaft.

*Pneumatic Oscillator*

In one embodiment of the invention the lateral oscillation drive mechanism may comprise a pneumatic oscillator, mounted adjacent to or within the machine so as to effect side to side oscillation of the brush assembly 102.

The presently preferred embodiment of the invention utilizes a commercially available pneumatic oscillator sold under the tradename Band Cylinder from Tol-O-Matic, Inc., 1028 South 3rd Street, Minneapolis, Minn. 55415. That device incorporates a load-bearing carrier system comprising an elongate mounting bracket and body having a slidable carrier bracket disposed thereon. A pneumatic cylinder positioned within the elongate body serves to propel the carrier bracket laterally back and forth therealong. Thus, when the band cylinder is mounted transversely under bracket 122 of the deburring machine, the traversing carrier bracket of the band cylinder may be attached directly or indirectly to the bracket 106 which connects the brush assembly 102 to the oscillation mechanism 104. The band cylinder is preferably provided with cushioned end stops or limit switches to create smooth deceleration at the end of each stroke, and smooth acceleration at the beginning of the reverse (next) stroke.

The preferred band cylinder which is usable as a pneumatic oscillator in connection with the deburring machine of the present invention is fully described and shown in a brochure entitled "Tol-O-Matic Band Cylinders, Distributed by the Tol-O-Matic Corporation."

The incorporation of a pneumatic oscillator within the oscillating head 130 of the deburring machine has been found to be particularly desirable in view of the low maintenance and high reliability of such pneumatic devices. It will be appreciated, however, that other mechanical sorts of oscillating heads may also be employed, such as the ball reverser shaft described below.

ii. Ball Reverser Shaft Oscillator

In an alternative embodiment of the invention, the lateral oscillation mechanism of the deburring machine may comprise a mechanical ball reverser shaft mounted within or adjacent to the machine. The ball reverser shaft, when rotated, will produce lateral, i.e. side to side movement, of the brush assembly 102. A presently preferred ball reverser shaft of the present invention shown in FIG. 4 comprises a generally cylindrical, rigid shaft having a spiral groove formed in the outer surface thereof. Such spiral groove is continuous such that, a ball mounting or other generally round object held within the groove will oscillate or traverse from one end of the groove to the opposite end of the groove.

Figure 4:
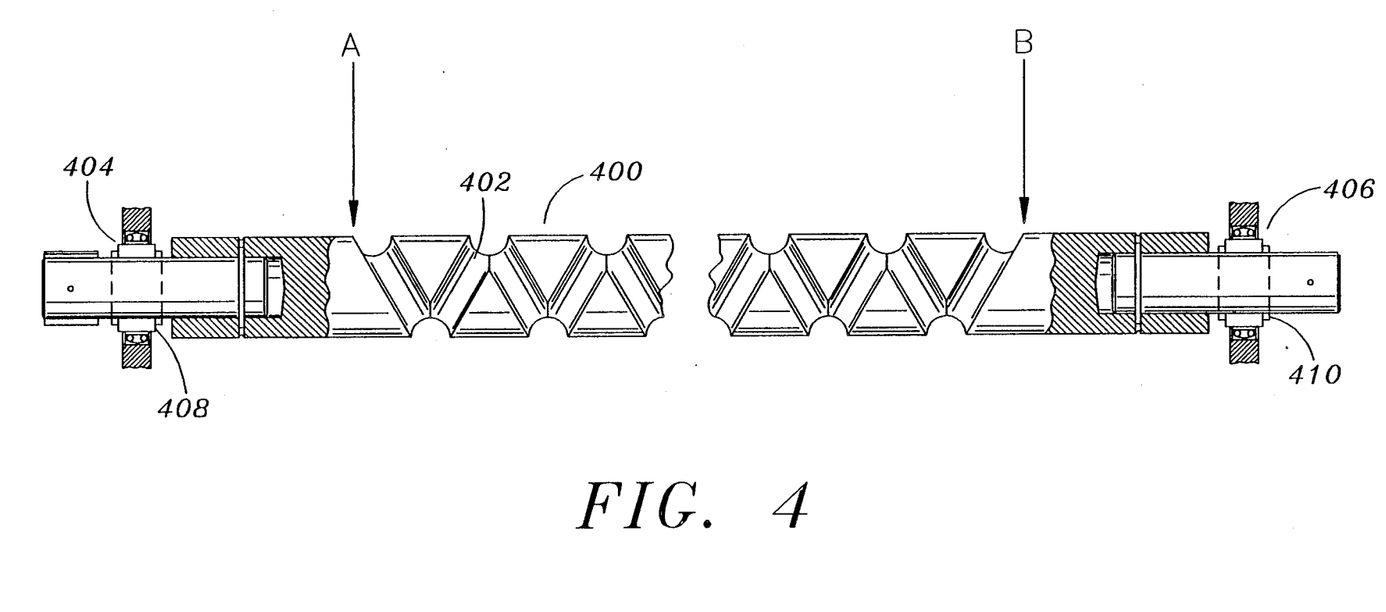
FIG. 4 is an elevational view of a preferred ball reverser shaft which may be incorporated in circuit board deburring machines of the present invention.

The cylindrical shaft or dowel 400 is rotatably mounted beneath bracket 122 of the deburring machine by way of rotatable mountings. The shaft 400 is connected to motor 110 so as to rotate at a substantially constant rate, giving rise to controlled, constant, back and forth oscillation of the brush assembly 102.

iii. Systems For Regulating Pressure on Brush Head

Figure 3A:
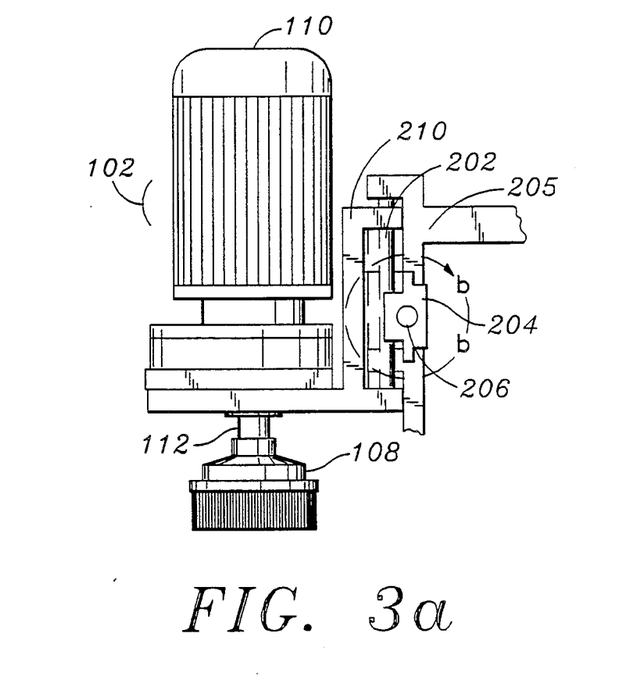
FIG. 3a is a side elevational view of a portion of a circuit board deburring machine of the present invention incorporating a presently preferred mechanism for adjusting the vertical height of the brush assembly.

FIG. 3a shows a portion of a deburring machine which includes an elevational servo for physically adjusting and/or regulating the vertical position of the brush assembly 102, thereby effecting controlled regulation of the downward pressure exerted by the rotating brush 108 on the circuit boards passing thereunder.

Specifically, the mechanical servo portion of the device comprises a vertical adjusting screw 202 having a gear box 204 mounted adjacent thereto. A horizontal adjustment shaft 206 passes through the gear box 204 and is connected at one end to a servo motor (not shown). The horizontal adjustment shaft 206 may be of any configuration and, is preferably of hexagonal cross-sectional configuration The preferred servo motor is a 250 watt, approximately ¼ hp. electric motor.

The vertical screw, 202 is firmly mounted on a traversing bracket 205. Traversing bracket 204 is connected to the brush assembly 102 of the deburring machine so as to oscillate or traverse back and forth in accordance therewith. A secondary bracket 210 connects the brush assembly 102 to the traversing bracket 205 in such manner as to carry the brush assembly 202 from side to side with the traversing bracket 205 while permitting the brush assembly 102 to travel up and down in relation to the traversing bracket 204.

Figure 3B:
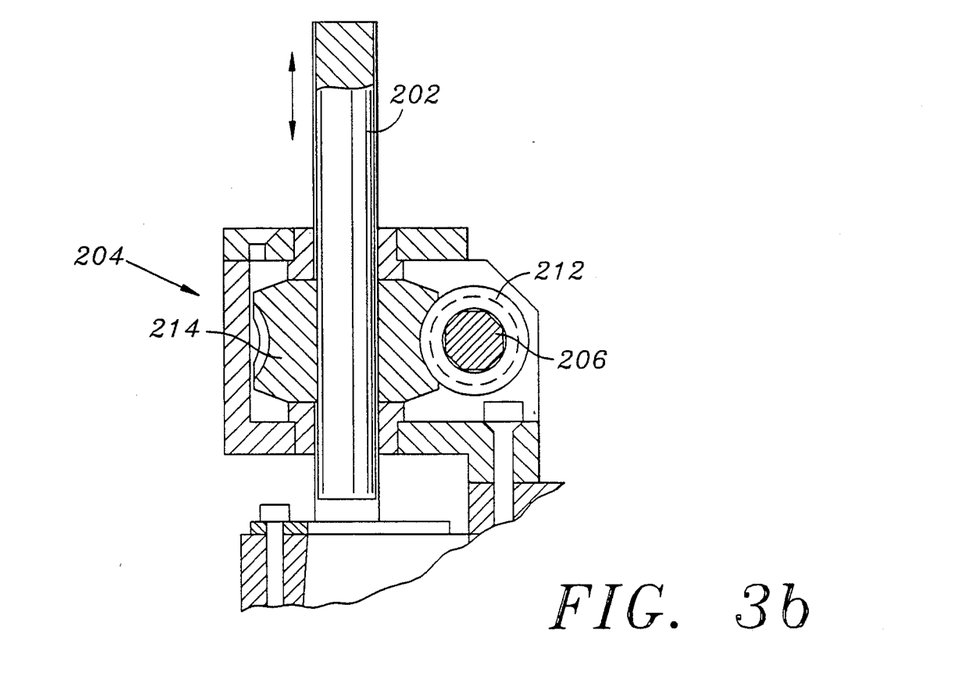

An enlarged cross-sectional view of gear box 204 and attendant structures is shown in FIG. 3b. Specifically, an endless worm 212 is mounted on the outer surface of horizontal adjustment shaft 206 within the region of the gear box 204. Endless worm 212 intermeshes with worm gear 214 such that rotation of the adjustment shaft 206 causes rotation of the endless worm 212, which in turn causes corresponding rotation of the worm gear 214. Such results in controlled clockwise or counter clockwise movement of the vertical screw 202.

Accordingly, when the control circuitry calls for downward adjustment of the vertical position of the rotating brush 108, the servo motor (not shown) will turn horizontal adjustment shaft 206 in a first direction. Such turning of the horizontal adjustment shaft 206 in the first direction will result in corresponding rotation of the vertical screw 202 with resultant downward movement of the brush assembly 102. Conversely, when the control circuitry calls for less downward pressure on rotating brush 108, the servo motor (not shown) will cause the horizontal adjustment shaft 206 to rotate in a second direction, thereby causing the vertical screw 202 to turn in a direction opposite its above-described first direction. Such will result in corresponding upward vertical movement of the brush assembly 102 thereby lessening the downward pressure exerted by brush head 108.

By this mechanism, the mechanical servo provides for continuous, controlled adjustment of the vertical brush height while the brush assembly 102 continues to traverse from side to side.

Figure 5:
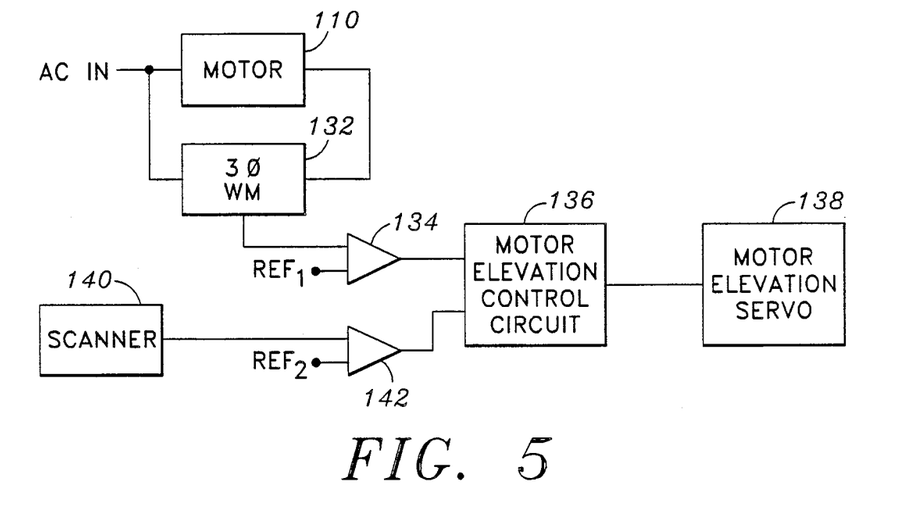
FIG. 5 is a circuit diagram illustrating a representative control circuit for regulating the elevation of the brush head.

FIG. 5 is a circuit diagram illustrating a representative control circuit for regulating the elevation of the brush head 108 via the above-described servo mechanism. FIG. 5 illustrates the novel manner in which the present invention regulates the elevation of the brush assembly 102. In accordance with the circuit shown at FIG. 3 the elevation of the brush assembly be closely regulated to provide a predictable and even finish along the surface of the printed circuit board. The surface finish may be regulated in accordance with the power drawn by the wattmeter, and also in accordance with the scanner that examines the finished product.

Referring to FIG. 5 the motor 110 is powered by an AC input. Three phase wattmeter 132 monitors the power drawn by motor 110 as it drives the brushes across the surface of the printed circuit board. As will be recognized by one of ordinary skill in the art the greater the pressure of the brushes against the surface of the printed circuit board the greater the power necessary to rotate the brush head at a substantially constant speed, e.g. where a synchronous motor is used to drive the brush head. Contemporary means for monitoring the operation of the motor include the use of a single phase ammeter instead of the three phase wattmeter. The use of such a single phase ammeter monitors only one aspect of the electrical operation of the motor, and therefore fails to monitor other electrical parameters indicative of the pressure applied the printed circuit board due to the vertical position of the brush head. The present invention corrects those deficiencies by use of the three phase wattmeter 132. In accordance with the presently preferred embodiment the functions of the three phase wattmeter 132 are implemented by a three phase wattmeter such as that available commercially from D.E.M. Controls of Montreal, Canada.

As shown at FIG. 5 signal from three phase wattmeter 132 is communicated to comparator 134. Another input to comparator 134 is identified as Ref 1. In the presently preferred embodiment Ref 1 is representative of a preselected finish on a surface of the printed circuit board. More particularly, Ref 1 could be indicative of the pressure with which the brush head presses against the surface of the printed circuit board. Comparator 134 operates to compare the preselected reference pressure with an output signal generated by three phase wattmeter 132. The output of comparator 134 may be viewed as an error signal used to conform the desired pressure with the actual pressure as represented by the signal from three phase wattmeter 132. The output of comparator 134 is communicated to motor elevation control circuit 136 which drives the motor elevation servo 138. For example, when the signal from three phase wattmeter 132 indicates that the brush head is positioned too high, motor elevation control circuit 136 (which may be microprocessor based) will generate a signal that will cause the motor elevation servo 138 to lower the brush head further against the surface of the printed circuit board. Conversely, should the output from the three phase wattmeter 132 indicate that the motor 110 is drawing too much power the motor elevation control circuit 136 would operate to raise the motor elevation servo 138 as necessary. The motor elevation servo 138 preferably incorporates a micro metric elevation control mechanism which allows for high resolution movement of the brush assembly vertical height. In the presently preferred embodiment vertical tolerances of 0.010–0.020 inches are commonly achieved.

It is to be understood that additional circuitry may be added to that set forth at FIG. 5 in order to properly scale the respective signals, filter undesirable transients and/or vary the responsiveness of the motor elevation servo to changes in the output from three phase wattmeter 132. The implementation of these and other enhancements are well known to those of ordinary skill in the art.

FIG. 5 also incorporates circuitry to regulate the height of the brush heads in response to output signals from one or more scanners which sense the thickness and/or finish characteristics of the printed circuit board. Representative scanner 140 may be positioned along the conveyor path past the rotating brush head 102. As the printed circuit board passes within the field of view of the scanner an output signal may be generated which is representative of factors such as the height and evenness of the finished surface. The scanner is positioned so as to sense the height and/or finish of the circuit board as it moves along the conveyor, approaching the rotating brush head 102. Upon determining the thickness and/or finish characteristics of the incoming circuit board, a signal will be sent from the optical scanner to provide a rough adjustment of the height of brush head 102 so as to properly meet the surface of the circuit board, thereby accommodating circuit boards of varying height and surface characteristics. After the rotating brush head has begun contact with the circuit board, the output of the three phase wattmeter 132 will control the elevation servo, thereby effecting further and possibly very minute changes in the height of the brush head as it passes over each circuit board surface. As each passing circuit board leaves contact with the rotating brush head 102, the brush head will then readjust to a new desired height in response to input received from the optical scanner 140 sensing the thickness or surface characteristics of the next incoming circuit board on the line.

In the presently preferred embodiment the functions of scanner 140 may be implemented by an optical scanner or sensor of the type commercially available through Omron Corporation of Japan. The output from scanner 140 may be communicated to a comparator 142 which compares the scanner output signal with a reference signal, i.e. Ref, representative of the desired surface characteristics of a finished board. The output from comparator 142 is communicated to motor elevation control circuit 146, which in turn drives motor elevation servo 138 as a primary adjustment. Thus, if the scanner output indicates that the brush head is too high the motor elevation control circuit 136 will drive the motor elevation servo 138 to lower the brush head. As will be recognized by one of ordinary skill in the art the output from scanner 140 may be filtered to identify certain wavelengths or patterns. The signal $Ref_2$ is preferably formatted differently than the conditioned signal from scanner 140 when the brush head is at its proper height. When the brush head is at its proper height, the signal received from the wattsmeter 132 overrides the primary signal from the scanner 140. Such override permits the brush to maintain a desired finish on each circuit board as it passes under the brush, but permits the brush head, after finishing with one circuit board, to readjust for the appropriate height and surface characteristics of the next incoming circuit board.

iv. Systems for Regulating Lateral Movement of the Brush Head

Figure 6:
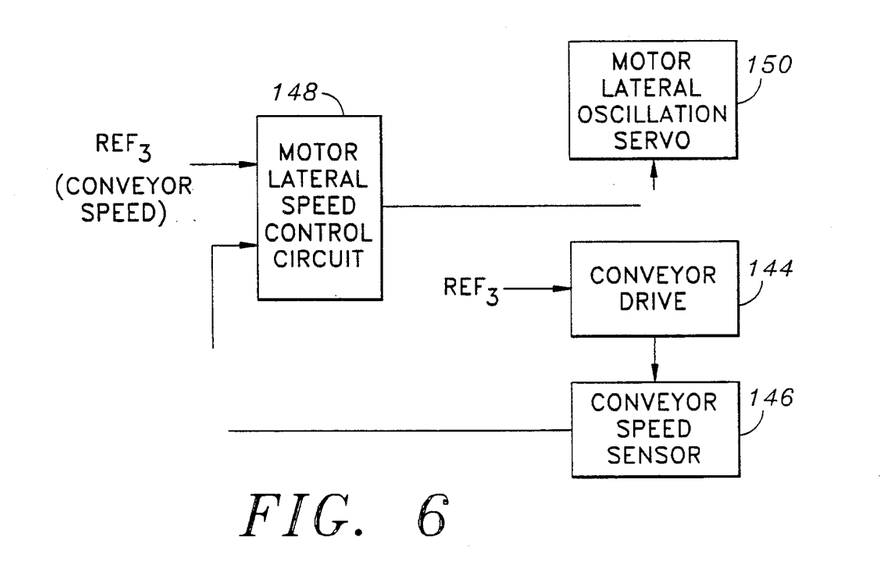
FIG. 6 is a circuit diagram illustrating a representative circuit for regulating the lateral speed of the brush head across the circuit board.

FIG. 4 illustrates an exemplary control signal for regulating the lateral movement of the brush assembly. As previously described lateral movement to the brush assembly may be effected by different types of pneumatic or mechanical mechanisms. The circuit of FIG. 6 is primarily intended to have application in connection with pneumatic oscillator previously described. However, it is understood that various other pneumatic and/or mechanical assemblies may be used within the scope of the invention, such that the circuit of FIG. 6 is not, in its broader aspects, limited to use in conjunction with the pneumatic oscillator.

In practice, the lateral speed of the brush assembly is approximately twice the lateral speed of the conveyor. Consequently, the brush head will make multiple passes over each portion of the printed circuit board surface. In the presently preferred embodiment the brush head crosses each portion of the printed circuit board surface three times.

It is to be understood that the conveyor speed may at times vary i.e. with respect to the lateral movement of the brush head. Thus, the surface of the printed circuit board may become uneven. The circuit of FIG. 6 is intended to regulate the lateral movement to the brush head with respect to the conveyor speed to avoid such unevenness.

Conveyor drive 144 typically operates at a set speed. The signal Ref may be representative of the anticipated set speed. However, that speed may vary. Conveyor speed sensor 146 senses the actual speed of the conveyor drive and communicates a responsive signal to motor lateral speed control circuit 148, which also receives the Ref signal. Control circuit 148 in turn generates an output signal which is communicated to motor lateral oscillation servo 150. In the presently preferred embodiment the servo 150 operates the pneumatic oscillator to regulate the lateral movement of the brush assembly. Thus, where the conveyor drive speed increases the control circuit 148 operates to increase the lateral speed of the brush assembly and maintain a substantially constant relationship between the brush assembly lateral speed and the conveyor speed.

It is to be understood that the circuitry of FIG. 4 may also be supplemented to provide further scaling, filtering, and responsivity as desired. Additionally, sensors may be provided to provide an actual measurement of the brush assembly lateral speed. These and other modifications and enhancements will be obvious to one of ordinary skill in the art.

What is claimed is:

1. A deburring system for finishing the surface of a printed circuit board passing along a moving conveyor, comprising:
    a rotating brush head for abrading against a first surface of the printed circuit board;
    a motor for driving the rotating brush head;
    an elevational servo for moving the brush head vertically with respect to the printed circuit board first surface;
    a three phase wattmeter connected to the motor for monitoring three phase power consumption of the motor and for generating ann output signal in response thereto;
    a control circuit connected to the three phase wattmeter and the elevation servo, the control circuit being operative to generate a first signal for regulating the operation of the elevational servo in response to an output signal from the three phase wattmeter; and
    a scanner disposed adjacent the moving conveyor before the rotating brush head for sensing the surface characteristics of the printed circuit board first surface before being abraded by the brush head and for generating an output signal in response thereto; and wherein said control circuit is further operative to generate a signal for regulating the operation of the elevation servo in response to the scanner output signal to effect preadjustment of the position of the brush head before it meets the circuit board.

2. The system as recited in claim 1 wherein the control circuit further comprises a comparator for comparing the three phase wattmeter output signal with a first reference signal, said first reference signal being representative of anticipated three phase power consumption of the motor to provide a desired surface finish on the first surface of the printed circuit board.

3. The system as recited in claim 2 wherein said first reference signal may be varied to effect different surface finish characteristics on the printed circuit board.

4. The system as recited in claim 1 wherein the control circuit further comprises a comparator for comparing the scanner output signal to a second reference signal, said second reference signal being representative of desired surface characteristics of the printed circuit board first surface.

5. The system as recited in claim 4 wherein the second reference signal may be varied to effect different surface finish characteristics on the first surface of the printed circuit board.

6. The system as recited in claim 4 wherein the conveyor speed control circuit is operative to compare the conveyor speed sensor output signal to a third reference signal, said third reference signal being representative of anticipated conveyor speed.

7. The system as recited in claim 4 wherein the lateral oscillation mechanism comprises a pneumatic cylinder.

8. The system as recited in claim 1 further comprising:

a lateral oscillation mechanism for moving the brush head perpendicular to the direction of movement of the conveyor across the printed circuit board first surface;

a conveyor speed sensor for sensing the speed of the conveyor and for generating an output signal in response thereto; and a conveyor speed control circuit for regulating the speed of the lateral oscillation mechanism in response to the conveyor speed sensor output signal.

9. The deburring system of claim 1 wherein said elevational servo comprises elevational adjustment linkage connectable to a bidirectional motor, said elevational adjustment linkage being operative to raise and lower said brush head relative to the printed circuit board first surface in response to the operation of said motor.

10. The deburring system of claim 9 wherein said elevational adjustment linkage comprises a vertical screw.

* * * * *

Disclaimer 4,993,097.—*Mark D'Amato*, Montreal, Canada. CIRCUIT BOARD DEBURRING SYSTEM. Patent dated Feb. 19, 1991. Disclaimer filed Dec. 10, 1990, by the assignee, D.E.M. Controls of Canada.

The term of this patent subsequent to Feb. 19, 2008, has been disclaimed.
[ *Official Gazette April 30, 1991* ]

UNITED STATES PATENT AND TRADEMARK OFFICE
CERTIFICATE OF CORRECTION

PATENT NO. : 4,993,097
DATED : February 19, 1991
INVENTOR(S) : Mark D'Amato

It is certified that error appears in the above—identified patent and that said Letters Patent is hereby corrected as shown below:

Column 4, line 15, before "pneumatic oscillator" please
    insert --i. --
Column 5, line 20, after "configuration" please insert --.--
Column 5, line 23, please change "204" to --205--
Column 5, line 31, please change "204" to --205--
Column 8, line 57, please delete "ann" and insert
    therefore --an--
On Sheet 4 of 4 of the drawings, please delete Figure 6 and
    replace with Figure 6 as shown below.

*FIG. 6*

UNITED STATES PATENT AND TRADEMARK OFFICE
CERTIFICATE OF CORRECTION

PATENT NO. : 4,993,097

DATED : February 19, 1991

INVENTOR(S) : Mark D'Amato

It is certified that error appears in the above—identified patent and that said Letters Patent is hereby corrected as shown below:

Column 6, line 33, please delete "Ref 1" and insert therefore --Ref $_1$--
Column 6, line 34, please delete "Ref 1" and insert therefore --Ref $_1$--
Column 6, line 35, please delete "Ref 1" and insert therefore --Ref $_1$--
Column 7, line 39, please delete "Ref ," and insert therefore --Ref $_2$--
Column 7, line 53, please delete "wattsmeter" and insert therefore --wattmeter--
Column 7, line 63, please delete "Fig. 4" and insert therefore --Fig. 6--
Column 8, line 22, please delete "Ref ," and insert therefore --Ref $_3$--
Column 8, line 28, please delete "Ref ," and insert therefore --Ref $_3$--
Column 8, line 38, please delete "Fig." and insert therefore --Fig. 6--
In the Abstract, sentence 16, please change the sentence to read as follows:
   line 16 delete "sur" after "incoming"
   line 17 delete "face of each incoming surface".

Signed and Sealed this

Twenty-ninth Day of September, 1992

Attest:

DOUGLAS B. COMER

Attesting Officer

Acting Commissioner of Patents and Trademarks